(12) United States Patent
Zhao

(10) Patent No.: US 9,373,646 B2
(45) Date of Patent: Jun. 21, 2016

(54) POLYSILICON TFT DEVICE AND MANUFACTURING METHOD THEREOF

(71) Applicant: Shenzhen China Star Optoelectronics Technology Co., Ltd., Shenzhen, Guangdong (CN)

(72) Inventor: Guo Zhao, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 35 days.

(21) Appl. No.: 14/234,994

(22) PCT Filed: Jan. 2, 2014

(86) PCT No.: PCT/CN2014/070037
§ 371 (c)(1),
(2) Date: Jan. 24, 2014

(87) PCT Pub. No.: WO2015/096194
PCT Pub. Date: Jul. 2, 2015

(65) Prior Publication Data
US 2015/0187796 A1 Jul. 2, 2015

(30) Foreign Application Priority Data

Dec. 25, 2013 (CN) .......................... 2013 1 0725152

(51) Int. Cl.
| | |
|---|---|
| H01L 27/14 | (2006.01) |
| H01L 29/04 | (2006.01) |
| H01L 29/15 | (2006.01) |
| H01L 31/036 | (2006.01) |
| H01L 27/12 | (2006.01) |
| H01L 29/786 | (2006.01) |
| H01L 29/66 | (2006.01) |
| H01L 29/10 | (2006.01) |

(52) U.S. Cl.
CPC .......... *H01L 27/124* (2013.01); *H01L 27/1222* (2013.01); *H01L 27/1259* (2013.01); *H01L 29/1033* (2013.01); *H01L 29/6675* (2013.01); *H01L 29/78672* (2013.01)

(58) Field of Classification Search
CPC .............. H01L 27/124; H01L 29/1033; H01L 29/78672; H01L 29/6675; H01L 27/1222; H01L 29/41733; H01L 29/42384; H01L 29/78696; H01L 29/4908; H01L 27/3248; H01L 27/3262
See application file for complete search history.

(56) References Cited

U.S. PATENT DOCUMENTS

2004/0191970 A1* 9/2004 Sun .................... H01L 27/12 438/166
2005/0179040 A1* 8/2005 Tanaka .............. G02F 1/136213 257/72

*Primary Examiner* — Thanh Y Tran
(74) *Attorney, Agent, or Firm* — Andrew C. Cheng

(57) ABSTRACT

The present invention discloses a polysilicon TFT device and the manufacturing method thereof. The polysilicon TFT device comprises: a scanning line and a data line arranged alternately; a semiconductor layer electrically connected with the scanning line and the data line; and a pixel electrode electrically connected with the semiconductor layer. Multiple channel regions and multiple doped regions are provided sequentially with interval between the connecting point of the semiconductor layer with the data line and the connecting point of the semiconductor layer with the pixel electrode, the channel regions are the portions of the semiconductor layer overlapping the scanning line, the rest portions are the doped regions, the width of at least one said doped region is 0.5~3 μm, the ion doping concentration is 2*E11~5*E15. In the present invention, the pattern of the semiconductor layer is designed as a bending pattern, which sequentially intersects the scanning lines and forms multiple channel regions and multiple doped regions provided with interval. It reduces the leakage current by controlling the width of the doped region and the ion doping concentration.

15 Claims, 2 Drawing Sheets

POLYSILICON TFT DEVICE AND MANUFACTURING METHOD THEREOF

This application claims priority to Chinese Patent Application Serial No. 201310725152.3, named as "polysilicon TFT device and manufacturing method thereof", filed on Dec. 25, 2013, the specification of which is incorporated herein by reference.

BACKGROUND OF THE INVENTION

1. Field of the Invention

The present invention relates to the technology fields of image display, and in particular to a polysilicon thin film transistor (TFT) device and the manufacturing method thereof.

2. The Related Arts

Amorphous silicon (a-Si) TFT technology has a simple process and low cost, but the carrier mobility is very small; at the same time, it can only provide N-type amorphous silicon TFT devices and it has problems in the role of stability under long-term stress function. Polysilicon TFT has higher carrier mobility and faster response speed, which is easy to achieve a dynamic video display with large area. Meanwhile, the high carrier mobility can integrate the peripheral driver circuits on the display backplane, which will greatly reduce the external leads and the complexity of the peripheral drive circuit. Currently, the international community generally conducted the AMOLED backplane research and development project using polysilicon TFT.

The channel region of Polysilicon TFT is formed by first forming an amorphous silicon layer on the substrate, and then followed by the recrystallization process on the amorphous silicon layer. The method of recrystallization process includes metal induced crystallization or metal induced lateral crystallization.

Among these methods, metal induced lateral crystallization has better uniformity and cheaper in the TFT device compared to other techniques, which is easier to achieve the requirement of AMOLED display with large size. Meanwhile, the cost of the metal induced lateral crystallization is much cheaper. In addition, as comparing to metal induced crystallization, metal induced lateral crystallization techniques can effectively reduce the residual metal contamination in the channel region.

The main bottleneck in the current AMOLED backplane using metal induced lateral crystallization technology is unable to reduce the leakage current of the TFT. In order to ensure the display of each pixel displaying normally in one frame time, it is necessary to ensure that leakage current will not cause the decreasing voltage value of the storage capacitor more than one gray level when the switching transistor is off. However, because small amount of metal residues is still present in the Polysilicon TFT obtained using metal induced lateral crystallization, the high leakage current of TFT restricts the realization of high-grayscale and high-quality display.

SUMMARY OF THE INVENTION

The technical issue to be solved by the present invention is to provide a polysilicon TFT device which can effectively reduce the leakage current and the manufacturing method thereof.

In order to solve the technical issue, the embodiment according to the present invention provides polysilicon TFT device, comprising:
a scanning line and a data line arranged alternately;
a semiconductor layer electrically connected with the scanning line and the data line; and
a pixel electrode electrically connected with the semiconductor layer;
wherein, multiple channel regions and multiple doped regions are provided sequentially with interval between the connecting point of the semiconductor layer with the data line and the connecting point of the semiconductor layer with the pixel electrode, the channel regions are the portions of the semiconductor layer overlapping the scanning line, the rest portions are the doped regions, the width of at least one said doped region is 0.5~3 µm, the ion doping concentration is 2*E11~5*E15.

Wherein, the scanning line comprises a mainline and multiple branches, a first branch is located above the mainline and is connected with the mainline along the extending direction of said main line; a second branch and a third branch extend downward from the mainline and perpendicular to the mainline; the first branch, the second branch, and the third branch are rectangular and located between two data lines.

Wherein, the pattern of the semiconductor layer is substantially U-shaped, in the order from a first connecting point to a second connecting point, which intersects the first branch and the mainline of the scanning line, the overlapping portion forms a first channel region; which intersects the second branch and the third branch of the scanning line, the overlapping portions respectively form a second channel region and a third channel region, a first doped region is formed between the first channel region and the second channel region, a second doped region is formed between the second channel region and the third channel region; which intersects the mainline of the scanning line, the overlapping portion forms a fourth channel region, a third doped region is formed between the third channel region and the fourth channel region.

Wherein, a source region is formed between the first connecting point and the first channel region, a drain region is formed between the second connecting point and the fourth channel region, the first connecting point and the second connecting point are contact holes, the source region is electrically connected to the data line through a first contact hole, the drain region is electrically connected to the pixel electrode through a second contact hole.

Wherein, the scanning line comprises a mainline and multiple branches, a first branch is located at the left of the data line and extends downward from the mainline and perpendicular to the mainline; a second branch is L-shaped, which is located above the mainline and at the left of the data line, and is connected with the mainline; a third branch is located at the right of the data line, which is perpendicular to the mainline and extends up and down the two sides of the mainline; the first branch, the second branch, and the third branch are rectangular.

Wherein, the pattern of the semiconductor layer is substantially a square helical structure, in the order from a first connecting point to a second connecting point, which intersects the first branch of the scanning line, the overlapping portion forms a first channel region; which intersects the mainline of the scanning line, the overlapping portion forms a second channel region, a first doped region is formed between the first channel region and the second channel region; which intersects the second branch of the scanning line, the overlapping portion forms a third channel region, a second doped region is formed between the second channel region and the third channel region; which intersects the third branch of the scanning line, the overlapping portion forms a fourth channel region, a third doped region is formed between the third channel region and the fourth channel region; which intersects the mainline and the second branch of the scanning line, the overlapping portion forms a fifth channel region, a fourth doped region is formed between the fourth channel region and the fifth channel region.

Wherein, a source region is formed between the first connecting point and the first channel region, a drain region is formed between the second connecting point and the fifth channel region, the first connecting point and the second connecting point are contact holes, the source region is electrically connected to the data line through a first contact hole, the drain region is electrically connected to the pixel electrode through a second contact hole.

Wherein, the scanning line comprises a mainline and multiple branches, a first branch is substantially flat-arch-shaped, which comprises a first segment, a second segment, and a third segment, the first segment is located at the left of the data line and extends upward from the mainline and perpendicular to the mainline, the second segment is located above the mainline and is parallel with the mainline, the third segment is located at the right of the data line, which is perpendicular to the mainline and extends up and down the two sides of the mainline; a second branch is located at the left of the data line and extends downward from the mainline and perpendicular to the mainline; the first segment, the second segment, the third segment, and the second branch are rectangular.

Wherein, the pattern of the semiconductor layer is substantially a square helical structure, in the order from a first connecting point to a second connecting point, which sequentially intersects the second segment and the third segment of the first branch of the scanning line, the overlapping portion forms a first channel region; which intersects the second branch of the scanning line, the overlapping portion forms a second channel region, a first doped region is formed between the first channel region and the second channel region; which intersects the mainline and the first segment of the first branch of the scanning line, the overlapping portion forms a third channel region, a second doped region is formed between the second channel region and the third channel region.

Wherein, a source region is formed between the first connecting point and the first channel region, a drain region is formed between the second connecting point and the third channel region, the first connecting point and the second connecting point are contact holes, the source region is electrically connected to the data line through a first contact hole, the drain region is electrically connected to the pixel electrode through a second contact hole.

Wherein, a common electrode is provided on the data line.

The present invention further provides a polysilicon TFT device, comprising:
a scanning line and a data line arranged alternately;
a semiconductor layer electrically connected with the scanning line and the data line; and
a pixel electrode electrically connected with the semiconductor layer;
wherein, multiple channel regions and multiple doped regions are provided sequentially with interval between the connecting point of the semiconductor layer with the data line and the connecting point of the semiconductor layer with the pixel electrode, the channel regions are the portions of the semiconductor layer overlapping the scanning line, the rest portions are the doped regions, the width of at least one said doped region is 0.5~3 μm, the ion doping concentration is $2*E11~5*E15$;
wherein, the scanning line comprises a mainline and multiple branches, a first branch is located above the mainline and is connected with the mainline along the extending direction of said main line; a second branch and a third branch extend downward from the mainline and perpendicular to the mainline; the first branch, the second branch, and the third branch are rectangular and located between two data lines.

Wherein, the pattern of the semiconductor layer is substantially U-shaped, in the order from a first connecting point to a second connecting point, which intersects the first branch and the mainline of the scanning line, the overlapping portion forms a first channel region; which intersects the second branch and the third branch of the scanning line, the overlapping portions respectively form a second channel region and a third channel region, a first doped region is formed between the first channel region and the second channel region, a second doped region is formed between the second channel region and the third channel region; which intersects the mainline of the scanning line, the overlapping portion forms a fourth channel region, a third doped region is formed between the third channel region and the fourth channel region.

Wherein, a source region is formed between the first connecting point and the first channel region, a drain region is formed between the second connecting point and the fourth channel region, the first connecting point and the second connecting point are contact holes, the source region is electrically connected to the data line through a first contact hole, the drain region is electrically connected to the pixel electrode through a second contact hole.

Wherein, the scanning line comprises a mainline and multiple branches, a first branch is located at the left of the data line and extends downward from the mainline and perpendicular to the mainline; a second branch is L-shaped, which is located above the mainline and at the left of the data line, and is connected with the mainline; a third branch is located at the right of the data line, which is perpendicular to the mainline and extends up and down the two sides of the mainline; the first branch, the second branch, and the third branch are rectangular.

The present invention further provides a manufacturing method of polysilicon TFT device, comprising:
step S1, providing a scanning line and a data line arranged alternately;
step S2, providing a semiconductor layer electrically connected with the scanning line and the data line, and a pixel electrode electrically connected with the semiconductor layer;
step S3, forming multiple channel regions and multiple doped regions sequentially with interval between the connecting point of the semiconductor layer with the data line and the connecting point of the semiconductor layer with the pixel electrode, the channel regions being the portions of the semiconductor layer overlapping the scanning line, the rest portions being the doped regions, the width of at least one said doped region being 0.5~3 μm, the ion doping concentration being $2*E11~5*E15$.

Wherein, it further comprises the step of: forming a source region between the first connecting point and the first channel region, forming a drain region between the second connecting point and the fourth channel region.

Wherein, it further comprises the step of: forming a source region between the first connecting point and the first channel region, forming a drain region between the second connecting point and the fifth channel region.

Wherein, it further comprises the step of: forming a source region between the first connecting point and the first channel region, forming a drain region between the second connecting point and the third channel region.

Wherein, the first connecting point and the second connecting point are contact holes, the source region is electrically connected to the data line through a first contact hole, the drain region is electrically connected to the pixel electrode through a second contact hole.

In the present invention, the pattern of the semiconductor layer is designed as a bending pattern, which sequentially intersects the scanning lines and forms multiple channel regions and multiple doped regions provided with interval. It reduces the leakage current by controlling the width of the doped region and the ion doping concentration.

BRIEF DESCRIPTION OF THE DRAWINGS

In order to more clearly illustrate the embodiment of the present invention or the technical issue of the prior art, the accompanying drawings and the detailed descriptions are as follows. Obviously, the following description of the accompanying drawings are only some embodiments according to the present invention, for persons of ordinary skill in this field, they can also obtain other drawings based on these drawings without creative effort.

DETAILED DESCRIPTION OF THE PREFERRED EMBODIMENTS

The detailed descriptions accompanying drawings and the embodiment of the present invention are as follows.

In the polysilicon TFT device according to the present invention, the doped regions and the channel regions are provided with interval in the semiconductor layer. Multiple channel regions and multiple doped regions are provided sequentially with interval between the connecting point of the semiconductor layer with the data line and the connecting point of the semiconductor layer with the pixel electrode, the channel regions are the portions of the semiconductor layer overlapping the scanning line, the rest portions are the doped regions, which can reduce the leakage current of the semiconductor layer. Three embodiments are specifically described as follows.

Figure 1:
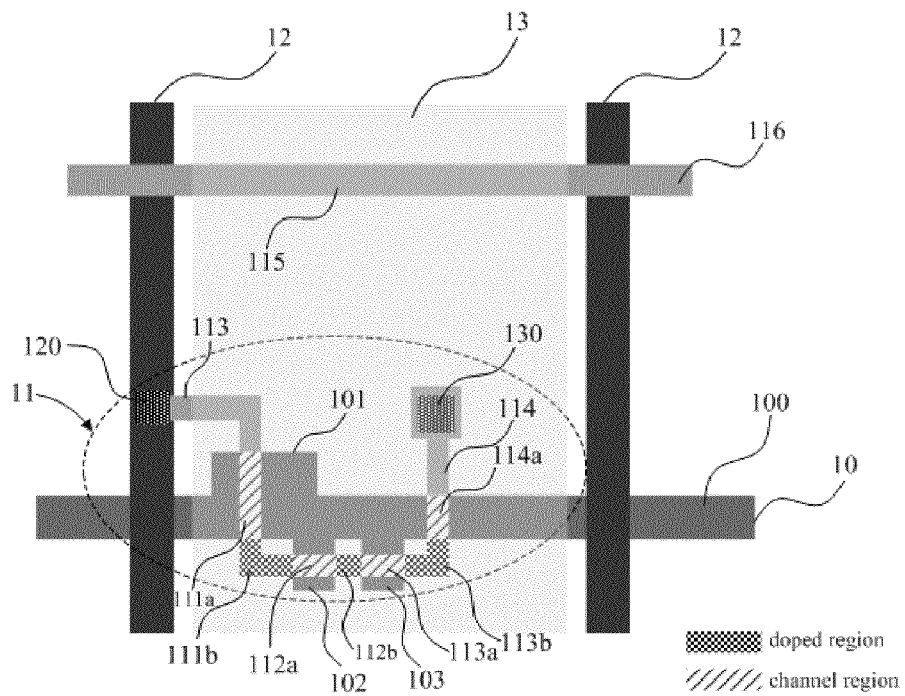
FIG. 1 is a schematic view illustrating the structure of a polysilicon TFT device according to the first embodiment of the present invention.

Referring to FIG. 1, the polysilicon TFT device according to the first embodiment of the present invention comprises a scanning line 10 and a data line 12 arranged alternately, a semiconductor layer 11 electrically connected with the scanning line 10 and the data line 12 (shown as dashed box in FIG. 1), and a pixel electrode 13 electrically connected with the semiconductor layer 11. Wherein, multiple channel regions and multiple doped regions are provided sequentially with interval between a first connecting point 120 of the semiconductor layer 11 with the data line 12 and a second connecting point 130 of the semiconductor layer 11 with the pixel electrode 13. The channel regions are the portions of the semiconductor layer 11 overlapping the scanning line 10, and the rest portions are the doped regions.

Specifically, the scanning line 10 comprises a mainline 100 and multiple branches. A first branch 101 is located above the mainline 100 and is connected with the mainline 100 along the extending direction of said main line 100; a second branch 102 and a third branch 103 extend downward from the mainline 100 and perpendicular to the mainline 100. The first branch 101, the second branch 102, and the third branch 103 are rectangular and located between two data lines 12.

The scanning line 10 comprises multiple branches. By designing the pattern of the semiconductor layer 11 as a bending pattern, which sequentially intersects the mainline 100 and each branch, forming multiple channel regions and multiple doped regions provided with interval. In the present embodiment, the pattern of the semiconductor layer 11 is substantially U-shaped, in the order from the first connecting point 120 to the second connecting point 130, which intersects the first branch 101 and the mainline 100 of the scanning line, the overlapping portion forms a first channel region 111a; which intersects the second branch 102 and the third branch 103 of the scanning line, the overlapping portions respectively form a second channel region 112a and a third channel region 113a, a first doped region 111b is formed between the first channel region 111a and the second channel region 112a, a second doped region 112b is formed between the second channel region 112a and the third channel region 113a; the semiconductor layer 11 intersects the mainline 100 of the scanning line, the overlapping portion forms a fourth channel region 114a, a third doped region 113b is formed between the third channel region 113a and the fourth channel region 114a.

A source region 113 is formed between the first connecting point 120 and the first channel region 111a, a drain region 114 is formed between the second connecting point 130 and the fourth channel region 114a. Specifically, the first connecting point 120 and the second connecting point 130 are contact holes, the source region 113 is electrically connected to the data line 12 through a first contact hole 120, and the drain region 114 is electrically connected to the pixel electrode 13 through a second contact hole 130.

Moreover, in the present embodiment, a storage capacitor 115 is provided under the pixel electrode 13, and a common electrode 116 is provided between the storage capacitor 115 and the pixel electrode 13. Because the storage capacitor 115 and the common electrode 116 are far away from the regions of the semiconductor layer 11 intersecting the scanning lines 10, the position design thereof is very flexible.

Figure 2:
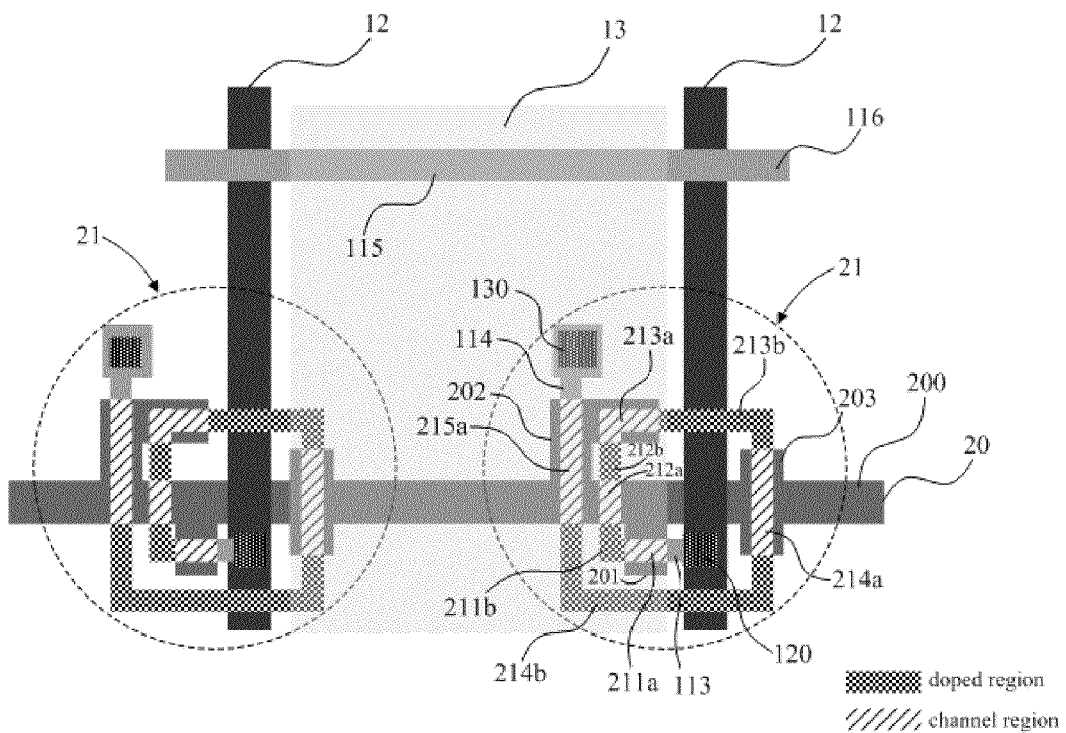
FIG. 2 is a schematic view illustrating the structure of a polysilicon TFT device according to the second embodiment of the present invention.

Referring to FIG. 2, the polysilicon TFT device according to the second embodiment of the present invention comprises a scanning line 20 and a data line 12 arranged alternately, a semiconductor layer 21 electrically connected with the scanning line 20 and the data line 12 (shown as dashed box in FIG. 2), and a pixel electrode 13 electrically connected with the semiconductor layer 21. Wherein, multiple channel regions and multiple doped regions are provided sequentially with interval between a first connecting point 120 of the semiconductor layer 21 with the data line 12 and a second connecting point 130 of the semiconductor layer 21 with the pixel electrode 13. The channel regions are the portions of the semiconductor layer 21 overlapping the scanning line 20, and the rest portions are the doped regions.

Comparing with the first embodiment, the scanning line 20 and the semiconductor layer 21 according to the present embodiment are different. Specifically, the scanning line 20 comprises a mainline 200 and multiple branches. A first branch 201 is located at the left of the data line 12 and extends downward from the mainline 200 and perpendicular to the mainline 200; a second branch 202 is L-shaped, which is located above the mainline 200 and at the left of the data line 12, and is connected with the mainline 200; a third branch 203 is located at the right of the data line 12, which is perpendicular to the mainline 200 and extends up and down the two sides of the mainline 200. The first branch 201, the second branch 202, and the third branch 203 are rectangular.

The scanning line 20 comprises multiple branches. By designing the pattern of the semiconductor layer 21 as a bending pattern, which sequentially intersects the mainline 200 and each branch, forming multiple channel regions and multiple doped regions provided with interval. In the present embodiment, the pattern of the semiconductor layer 21 is substantially a square helical structure, in the order from the first connecting point 120 to the second connecting point 130, which intersects the first branch 201 of the scanning line, the overlapping portion forms a first channel region 211a; which intersects the mainline 200 of the scanning line, the overlapping portion forms a second channel region 212a, a first doped region 211b is formed between the first channel region 211a and the second channel region 212a; which intersects the second branch 202 of the scanning line, the overlapping portion forms a third channel region 213a, a second doped region 212b is formed between the second channel region 212a and the third channel region 213a; which intersects the third branch 303 of the scanning line, the overlapping portion forms a fourth channel region 214a, a third doped region 213b is formed between the third channel region 213a and the fourth channel region 214a; which intersects the mainline 200 and the second branch 202 of the scanning line, the overlapping portion forms a fifth channel region 215a, a fourth doped region 214b is formed between the fourth channel region 214a and the fifth channel region 215a.

A source region 113 is formed between the first connecting point 120 and the first channel region 211a, a drain region 114 is formed between the second connecting point 130 and the fifth channel region 215a. Specifically, the first connecting point 120 and the second connecting point 130 are contact holes, the source region 113 is electrically connected to the data line 12 through a first contact hole 120, and the drain region 114 is electrically connected to the pixel electrode 13 through a second contact hole 130.

Moreover, in the present embodiment, a storage capacitor 115 is provided under the pixel electrode 13, and a common electrode 116 is provided between the storage capacitor 115 and the pixel electrode 13. Because the storage capacitor 115 and the common electrode 116 are far away from the regions of the semiconductor layer 21 intersecting the scanning lines 20, the position design thereof is very flexible.

Figure 3:
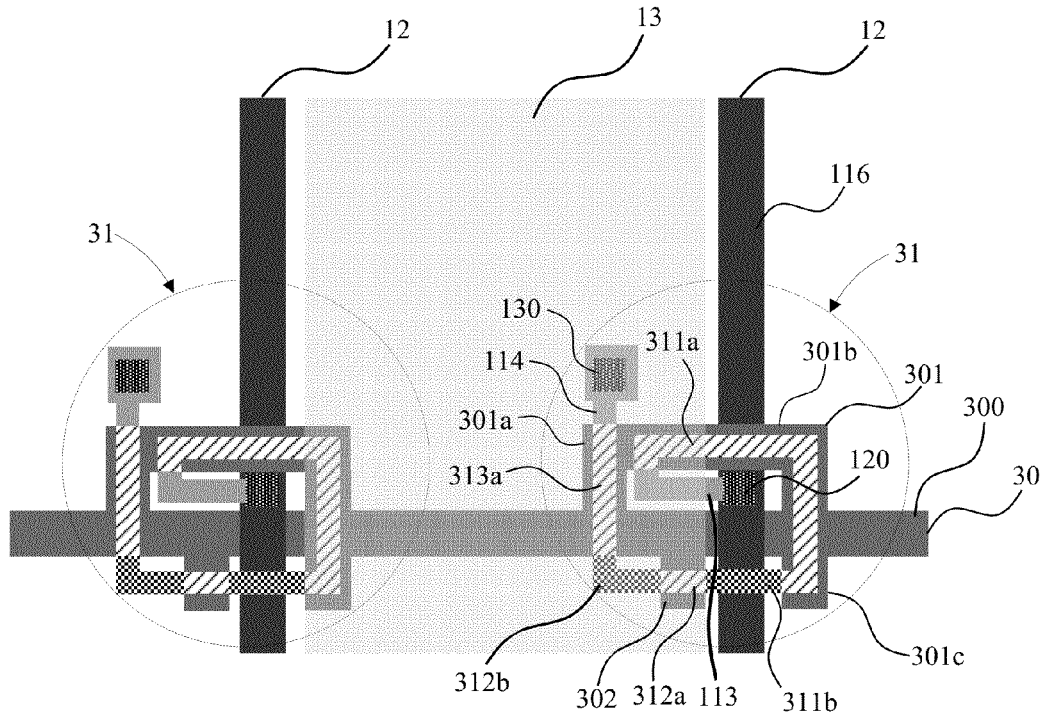
FIG. 3 is a schematic view illustrating the structure of a polysilicon TFT device according to the third embodiment of the present invention.

Referring to FIG. 3, the polysilicon TFT device according to the third embodiment of the present invention comprises a scanning line 30 and a data line 12 arranged alternately, a semiconductor layer 31 electrically connected with the scanning line 30 and the data line 12 (shown as dashed box in FIG. 3), and a pixel electrode 13 electrically connected with the semiconductor layer 31. Wherein, multiple channel regions and multiple doped regions are provided sequentially with interval between a first connecting point 120 of the semiconductor layer 31 with the data line 12 and a second connecting point 130 of the semiconductor layer 31 with the pixel electrode 13. The channel regions are the portions of the semiconductor layer 31 overlapping the scanning line 30, and the rest portions are the doped regions.

Comparing with the first embodiment and the second embodiment, the scanning line 30 and the semiconductor layer 31 according to the present embodiment are different. Specifically, the scanning line 30 comprises a mainline 300 and multiple branches. A first branch 301 is substantially flat-arch-shaped, which comprises a first segment 301a, a second segment 301b, and a third segment 301c. The first segment 301a is located at the left of the data line 12 and extends upward from the mainline 300 and perpendicular to the mainline 300, the second segment 301b is located above the mainline 300 and is parallel with the mainline 300, the third segment 301c is located at the right of the data line 12, which is perpendicular to the mainline 300 and extends up and down the two sides of the mainline 300; a second branch 302 is located at the left of the data line 12 and extends downward from the mainline 300 and perpendicular to the mainline 300. The first segment 301a, the second segment 301b, the third segment 301c, and the second branch 302 are rectangular.

The scanning line 30 comprises multiple branches. By designing the pattern of the semiconductor layer 31 as a bending pattern, which sequentially intersects the mainline 300 and each branch, forming multiple channel regions and multiple doped regions provided with interval. In the present embodiment, the pattern of the semiconductor layer 31 is substantially a square helical structure, in the order from the first connecting point 120 to the second connecting point 130, which sequentially intersects the second segment 301b and the third segment 301c of the first branch 301 of the scanning line, the overlapping portion forms a first channel region 311a; which intersects the second branch 302 of the scanning line, the overlapping portion forms a second channel region 312a, a first doped region 311b is formed between the first channel region 311a and the second channel region 312a; which intersects the mainline 300 and the first segment 301a of the first branch 301 of the scanning line, the overlapping portion forms a third channel region 313a, a second doped region 312b is formed between the second channel region 312a and the third channel region 313a.

A source region 113 is formed between the first connecting point 120 and the first channel region 311a, a drain region 114 is formed between the second connecting point 130 and the third channel region 313a. Specifically, the first connecting point 120 and the second connecting point 130 are contact holes, the source region 113 is electrically connected to the data line 12 through a first contact hole 120, the drain region 114 is electrically connected to the pixel electrode 13 through a second contact hole 130.

Moreover, in the present embodiment, a common electrode 116 is provided on the data line 12.

In the three embodiments mentioned above, the semiconductor layers are bending pattern, which sequentially intersects the scanning lines and forms multiple channel regions and multiple doped regions provided with interval (which gives three different combinations of the channel regions and the doped regions). It reduces the leakage current by controlling the width of the doped region and the ion doping concentration. Wherein, the doped region is lightly doped drain, the width of at least one said doped region is 0.5~3 μm, the ion doping concentration is 2*E11~5*E15, which can effectively reduce the leakage current.

Figure 4:
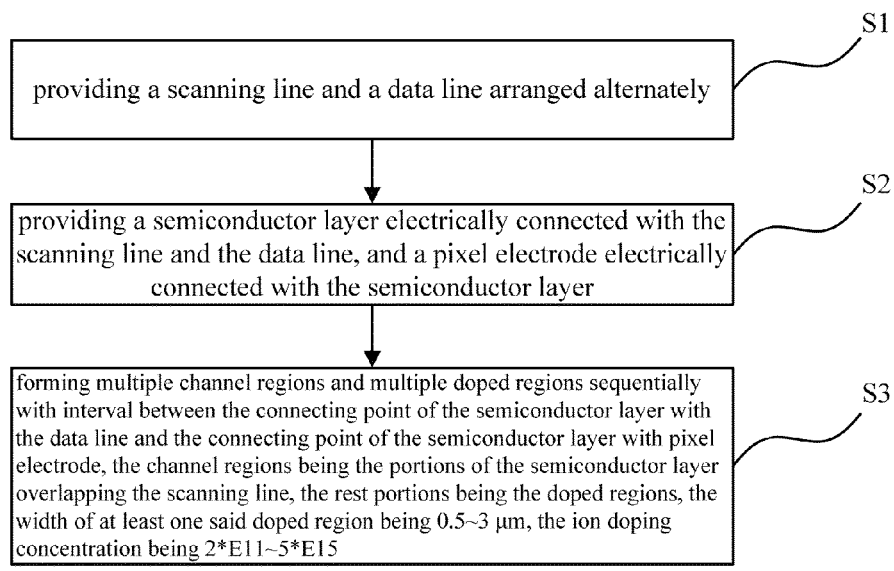
FIG. 4 is a flow chart of the manufacturing method of polysilicon TFT device according to the fourth embodiment of the present invention.

Referring to FIG. 4, the manufacturing method of the polysilicon TFT device according to the fourth embodiment of the present invention comprises:

step S1, providing a scanning line and a data line arranged alternately;

step S2, providing a semiconductor layer electrically connected with the scanning line and the data line, and a pixel electrode electrically connected with the semiconductor layer;

step S3, forming multiple channel regions and multiple doped regions sequentially with interval between the connecting point of the semiconductor layer with the data line and the connecting point of the semiconductor layer with pixel electrode, the channel regions being the portions of the semiconductor layer overlapping the scanning line, the rest portions being the doped regions, the width of at least one said doped region being 0.5~3 μm, the ion doping concentration being 2*E11~5*E15.

The structure of the scanning line and the combinations of the multiple channel regions and the doped regions of the semiconductor layer refer to the description of the first, second, and the third embodiments of the present invention and FIG. 1-3, which is not repeated here.

Specifically, corresponding to the first embodiment, the present embodiment further comprises the step of: forming a source region 113 between the first connecting point 120 and the first channel region 111a, forming a drain region 114 between the second connecting point 130 and the fourth channel region 114a.

Specifically, corresponding to the second embodiment, the present embodiment further comprises the step of: forming a source region 113 between the first connecting point 120 and the first channel region 211a, forming a drain region 114 between the second connecting point 130 and the fifth channel region 215a.

Specifically, corresponding to the third embodiment, the present embodiment further comprises the step of: forming a source region 113 between the first connecting point 120 and the first channel region 311a, forming a drain region 114 between the second connecting point 130 and the third channel region 313a.

Wherein, the first connecting point 120 and the second connecting point 130 are contact holes, the source region 113 is electrically connected to the data line 12 through a first contact hole 120, the drain region 114 is electrically connected to the pixel electrode 13 through a second contact hole 130.

Moreover, the present embodiment further comprises the step of: providing a storage capacitor 115 under the pixel electrode 13, and providing a common electrode 116 between the storage capacitor 115 and the pixel electrode 13. Or, it further comprises the step of: providing a common electrode 116 on the data line 12.

In the present invention, the pattern of the semiconductor layer is designed as a bending pattern, which sequentially intersects the scanning lines and forms multiple channel regions and multiple doped regions provided with interval. It reduces the leakage current by controlling the width of the doped region and the ion doping concentration.

The preferred embodiments according to the present invention are mentioned above, which cannot be used to define the scope of the right of the present invention. Those modifications and variations are considered encompassed in the scope of protection defined by the claims of the present invention.

What is claimed is:

1. A polysilicon TFT device, comprising:
a scanning line and a data line arranged alternately;
a semiconductor layer electrically connected with the scanning line and the data line; and
a pixel electrode electrically connected with the semiconductor layer;
wherein, multiple channel regions and multiple doped regions are provided sequentially with interval between a first connecting point of the semiconductor layer with the data line and a second connecting point of the semiconductor layer with the pixel electrode, the channel regions are the portions of the semiconductor layer overlapping the scanning line, the rest portions of the semiconductor layer are the doped regions, wherein a width of at least one of the doped regions is 0.5~3 μm, and an ion doping concentration 2*E11~5*E15.

2. The polysilicon TFT device as claimed in claim 1, wherein the scanning line comprises a mainline and multiple branches, a first branch is located above the mainline and is connected with the mainline along an extending direction of the mainline; a second branch and a third branch extend downward from the mainline and perpendicular to the mainline; the first branch, the second branch, and the third branch are rectangular and located between two data lines.

3. The polysilicon TFT device as claimed in claim 2, wherein a pattern of the semiconductor layer is substantially U-shaped and the semiconductor layer forms a first channel region, a first doped region, a second channel region, a second doped region, a third channel region, a third doped region and a fourth channel region in an order from the first connecting point to the second connecting point, wherein the first channel region overlaps the first branch and the mainline of the scanning line; the second channel region and the third channel region overlap the second branch and the third branch of the scanning line, respectively; the first doped region is formed between the first channel region and the second channel region, the second doped region is formed between the second channel region and the third channel region; the fourth channel region overlaps the mainline of the scanning line; the third doped region is formed between the third channel region and the fourth channel region.

4. The polysilicon TFT device as claimed in claim 3, wherein a source region is formed between the first connecting point and the first channel region, a drain region is formed between the second connecting point and the fourth channel region, the first connecting point and the second connecting point are contact holes, the source region is electrically connected to the data line through a first contact hole, the drain region is electrically connected to the pixel electrode through a second contact hole.

5. The polysilicon TFT device as claimed in claim 1, wherein the scanning line comprises a mainline and multiple branches, a first branch is located at the left of the data line and extends downward from the mainline and perpendicular to the mainline; a second branch is L-shaped, which is located above the mainline and at the left of the data line, and is connected with the mainline; a third branch is located at the right of the data line, which is perpendicular to the mainline and extends up and down two sides of the mainline; the first branch, the second branch, and the third branch are rectangular.

6. The polysilicon TFT device as claimed in claim 5, wherein a pattern of the semiconductor layer is substantially a square helical structure and the semiconductor layer forms a first channel region, a first doped region, a second channel region, a second doped region, a third channel region, a third doped region, a fourth channel region, a fourth doped region and a fifth channel region in an order from the first connecting point to the second connecting point, wherein the first channel region overlaps the first branch of the scanning line; the second channel region overlaps the mainline of the scanning line; the first doped region is formed between the first channel region and the second channel region; the third channel region overlaps the second branch of the scanning line, the second doped region is formed between the second channel region and the third channel region; the fourth channel region overlaps the third branch of the scanning line; the third doped region is formed between the third channel region and the fourth channel region; the fifth channel region overlaps the mainline and the second branch of the scanning line; the fourth doped region is formed between the fourth channel region and the fifth channel region.

7. The polysilicon TFT device as claimed in claim 6, wherein a source region is formed between the first connecting point and the first channel region, a drain region is formed between the second connecting point and the fifth channel region, the first connecting point and the second connecting point are contact holes, the source region is electrically connected to the data line through a first contact hole, the drain region is electrically connected to the pixel electrode through a second contact hole.

8. The polysilicon TFT device as claimed in claim 1, wherein the scanning line comprises a mainline and multiple branches, a first branch is substantially flat-arch-shaped, which comprises a first segment, a second segment, and a third segment, the first segment is located at the left of the data line and extends upward from the mainline and perpendicular to the mainline, the second segment is located above the mainline and is parallel with the mainline, the third segment is located at the right of the data line, which is perpendicular to the mainline and extends up and down two sides of the mainline; a second branch is located at the left of the data line and extends downward from the mainline and perpendicular to the mainline; the first segment, the second segment, the third segment, and the second branch are rectangular.

9. The polysilicon TFT device as claimed in claim 8, wherein a pattern of the semiconductor layer is substantially a square helical structure and the semiconductor layer forms a first channel region, a first doped region, a second channel region, a second doped region and a third channel region in an order from a first connecting point to a second connecting point, wherein the first channel region overlaps the second segment and the third segment of the first branch of the scanning line; the second channel region overlaps the second branch of the scanning line; the first doped region is formed between the first channel region and the second channel region; the third channel region overlaps the mainline and the first segment of the first branch of the scanning line; the second doped region is formed between the second channel region and the third channel region.

10. The polysilicon TFT device as claimed in claim 9, wherein a source region is formed between the first connecting point and the first channel region, a drain region is formed between the second connecting point and the third channel region, the first connecting point and the second connecting point are contact holes, the source region is electrically connected to the data line through a first contact hole, the drain region is electrically connected to the pixel electrode through a second contact hole.

11. The polysilicon TFT device as claimed in claim 9, wherein a common electrode is provided on the data line.

12. A polysilicon TFT device, comprising:
a scanning line and a data line arranged alternately;
a semiconductor layer electrically connected with the scanning line and the data line; and
a pixel electrode electrically connected with the semiconductor layer;
wherein, multiple channel regions and multiple doped regions are provided sequentially with interval between a first connecting point of the semiconductor layer with the data line and a second connecting point of the semiconductor layer with the pixel electrode, the channel regions are the portions of the semiconductor layer overlapping the scanning line, the rest portions of the semiconductor layer are the doped regions, wherein a width of at least one of the doped regions is 0.5~3 μm, and an ion doping concentration is $2*E11$~$5*E15$;
wherein, the scanning line comprises a mainline and multiple branches, a first branch is located above the mainline and is connected with the mainline along an extending direction of the mainline; a second branch and a third branch extend downward from the mainline and perpendicular to the mainline; the first branch, the second branch, and the third branch are rectangular and located between two data lines.

13. The polysilicon TFT device as claimed in claim 12, wherein the scanning line comprises a mainline and multiple branches, a first branch is located at the left of the data line and extends downward from the mainline and perpendicular to the mainline; a second branch is L-shaped, which is located above the mainline and at the left of the data line, and is connected with the mainline; a third branch is located at the right of the data line, which is perpendicular to the mainline and extends up and down two sides of the mainline; the first branch, the second branch, and the third branch are rectangular.

14. The polysilicon TFT device as claimed in claim 12, wherein a pattern of the semiconductor layer is substantially U-shaped and the semiconductor layer forms a first channel region, a first doped region, a second channel region, a second doped region, a third channel region, a third doped region and a fourth channel region in an order from the first connecting point to the second connecting point, wherein the first channel region overlaps the first branch and the mainline of the scanning line; the second channel region and the third channel region overlap the second branch and the third branch of the scanning line, respectively; the first doped region is formed between the first channel region and the second channel region, the second doped region is formed between the second channel region and the third channel region; the fourth channel region overlaps the mainline of the scanning line; the third doped region is formed between the third channel region and the fourth channel region.

15. The polysilicon TFT device as claimed in claim 14, wherein a source region is formed between the first connecting point and the first channel region, a drain region is formed between the second connecting point and the fourth channel region, the first connecting point and the second connecting point are contact holes, the source region is electrically connected to the data line through a first contact hole, the drain region is electrically connected to the pixel electrode through a second contact hole.

* * * * *